US009045147B2

(12) United States Patent
Kasuya

(10) Patent No.: US 9,045,147 B2
(45) Date of Patent: Jun. 2, 2015

(54) ARTICLE TRANSPORT FACILITY

(75) Inventor: Toru Kasuya, Gifu (JP)

(73) Assignee: Daifuku Co., Ltd., Osaka (JP)

( * ) Notice: Subject to any disclaimer, the term of this patent is extended or adjusted under 35 U.S.C. 154(b) by 387 days.

(21) Appl. No.: 13/239,805

(22) Filed: Sep. 22, 2011

(65) Prior Publication Data

US 2012/0076623 A1 Mar. 29, 2012

(30) Foreign Application Priority Data

Sep. 27, 2010 (JP) ................................. 2010-215677

(51) Int. Cl.
*H01L 21/677* (2006.01)
*B61B 3/02* (2006.01)
*B61B 1/00* (2006.01)

(52) U.S. Cl.
CPC .............. *B61B 3/02* (2013.01); *H01L 21/6773* (2013.01); *H01L 21/67733* (2013.01); *B61B 1/005* (2013.01); *B65G 2201/0297* (2013.01)

(58) Field of Classification Search
CPC ..................... H01L 21/67727; H01L 21/6773; H01L 21/67733
USPC ............ 414/217.1, 343, 344, 940; 104/89, 91
See application file for complete search history.

(56) References Cited

U.S. PATENT DOCUMENTS

| 3,854,603 | A | * | 12/1974 | Walters | 104/91 |
|---|---|---|---|---|---|
| 4,936,223 | A | * | 6/1990 | Billings et al. | 104/102 |
| 5,064,331 | A | * | 11/1991 | Yamaguchi et al. | 414/344 |
| 5,924,833 | A | * | 7/1999 | Conboy et al. | 414/217 |
| 5,980,183 | A | * | 11/1999 | Fosnight | 414/222.01 |
| 6,157,866 | A | * | 12/2000 | Conboy et al. | 700/121 |
| 6,990,721 | B2 | * | 1/2006 | Mariano et al. | 29/469 |
| 7,887,278 | B2 | * | 2/2011 | Hoshino | 414/217.1 |
| 8,322,287 | B2 | * | 12/2012 | Oguro et al. | 104/91 |
| 2002/0064440 | A1 | * | 5/2002 | Ikeda et al. | 414/222.01 |
| 2007/0163461 | A1 | | 7/2007 | Shiwaku | |
| 2010/0215461 | A1 | | 8/2010 | Kamikawa et al. | |

FOREIGN PATENT DOCUMENTS

| JP | 01242305 A | * | 9/1989 | ................... 414/343 |
|---|---|---|---|---|
| JP | 6100163 A | | 4/1994 | |
| JP | 7303711 A | | 11/1995 | |
| JP | 200068348 A | | 3/2000 | |
| JP | 2002110762 A | | 4/2002 | |
| JP | 2006319154 A | | 11/2006 | |
| JP | 200722677 A | | 2/2007 | |
| JP | 2007191235 A | | 8/2007 | |
| JP | 2010192855 A | | 9/2010 | |
| JP | 2010222086 A | | 10/2010 | |

* cited by examiner

*Primary Examiner* — James Keenan
(74) *Attorney, Agent, or Firm* — The Webb Law Firm

(57) ABSTRACT

A transporting space of an article transport facility is divided into a first space and a second space by a wall having an opening. A first movable body that travels along a first travel rail in the first space and a second movable body that travels along a second travel rail in the second space are provided. A relay portion which can support an article without interfering with the shutter that can open and close the opening is provided in the first space. The first travel rail is arranged to extend adjacent a first space side transfer position for transferring articles between the first mobile body and the relay portion, and the second travel rail is arranged to extend adjacent a second space side transfer position for transferring articles between the second mobile body and the relay portion through the opening.

12 Claims, 6 Drawing Sheets

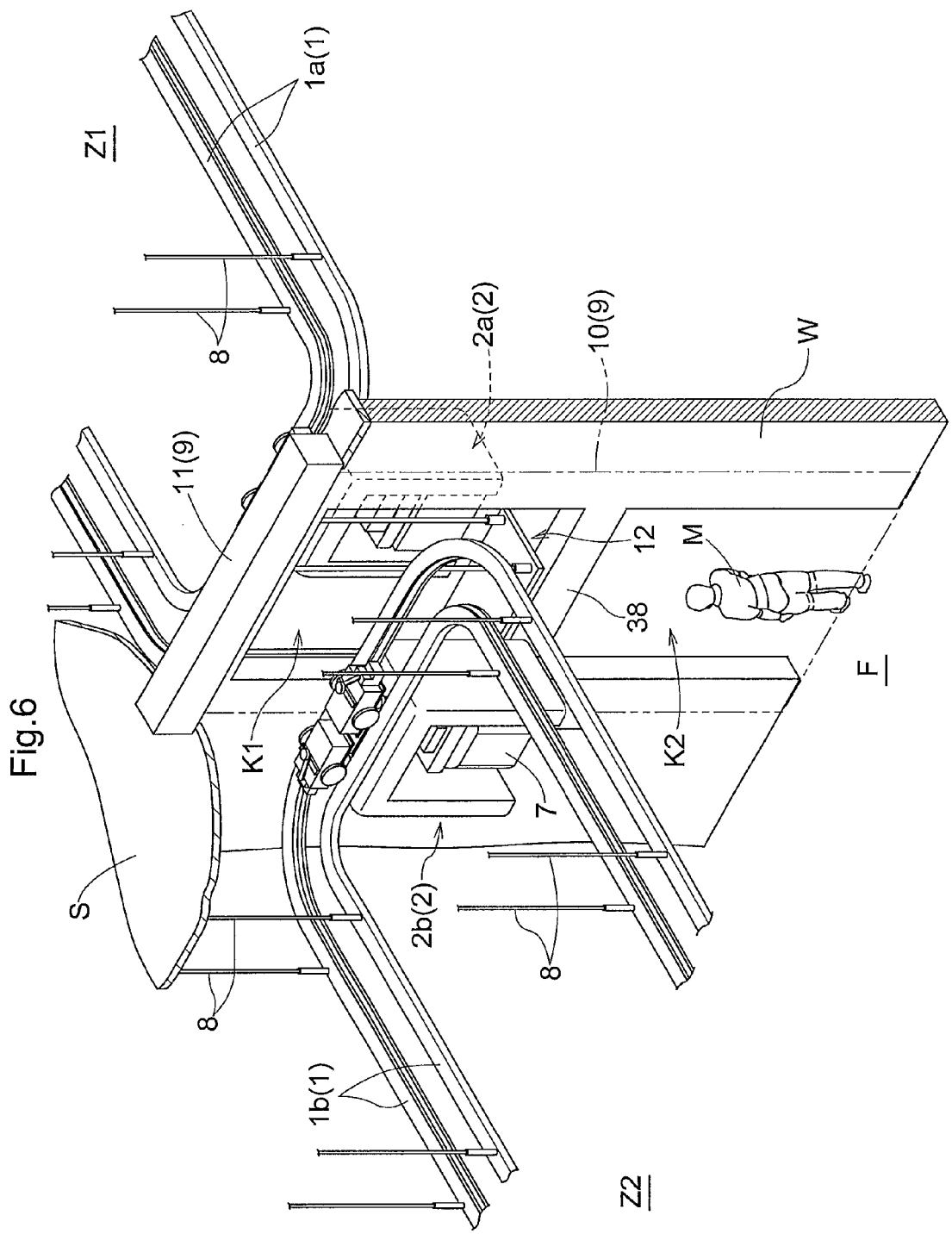

ARTICLE TRANSPORT FACILITY

BACKGROUND OF THE INVENTION

1. Field of the Invention

The present invention relates to an article transport facility having a movable body configured to travel along a travel rail provided in a transporting space and to transport an article.

2. Description of the Related Art

Article storage facilities such as one described above sometimes have a transporting space which is divided by a wall into a first space and a second space with an opening being formed in the wall for communication between the first space and the second space and with a shutter being provided that can open and close this opening. The shutter is provided to prevent a fire from spreading to the other space when the fire breaks out in either the first space or the second space, or to prevent flow of air between the spaces when the first and second spaces have a different atmospheric environment (that is, the state or condition of the air which fills respective space differs between the spaces).

In order to allow articles to be transported from the first space to the second space and vice versa in an article transport facility with a shutter for opening and closing an opening provided in a wall that divides the transporting space into the first space and the second space as described above, a travel rail is conventionally provided which extends through the opening from the first space to the second space to allow a movable body carrying an article to travel along the travel rail and through the opening to transport articles between the first space and the second space. (See, for example, JP Patent Application Publication No. H06-100163.)

As described in Publication H06-100163, when a travel rail is provided between the first space and the second space as described above, in order for the shutter for opening and closing the opening to close the opening properly, a portion of the travel rail that is located at a position corresponding to the opening-and-closing position of the shutter in the longitudinal direction of the travel rail needs to have a gap for allowing the shutter to pass. And the thickness of the shutter is made thinner than the dimension of this gap so that the opening can be closed properly when the shutter is closed.

In a conventional article transport facility, the travel rail is cut so as to form a gap for allowing the shutter to pass; so, the wheels of the movable body will have to travel over the cut location when the movable body passes the opening. This causes a problem that the cut location of the travel rail and wheels rub against or frictionally engage each other, which generates dust. In particular, when the transporting space is a clean environment such as in a semiconductor manufacturing factory, generation of dust poses a significant problem.

In addition, when the movable body passes the opening, traveling of the wheels of the movable body over the cut location causes vibration in the movable body, which in turn causes the article being transported to vibrate, which may result in undesired change in the attitude of the article or damages to the article. Therefore, in such conventional article transport facility, steps need to be taken to suppress vibration of the article. Furthermore, when vibration occurs in the movable body, this has negative effects on the mechanical parts of the movable body, or on the durability of the entire movable body. Thus, the presence of a cut or a gap in the travel rail is undesirable in this respect.

SUMMARY OF THE INVENTION

An object of the present invention is to solve at least one of the problems in the conventional facilities as described above.

In order to achieve this object, an article transport facility having a movable body configured to travel along a travel rail provided in a transporting space and to transport an article, said article transport facility comprises: a wall that divides the transporting space into a first space and a second space, the wall defining an opening for communication between the first space and the second space; a shutter configured to open and close the opening; a relay portion located in the first space at a location adjacent the opening and configured to support an article without interfering with the shutter; a first movable body configured to travel along a first travel rail, which is a part of the travel rail that is provided in the first space; a second movable body configured to travel along a second travel rail, which is a part of the travel rail that is provided in the second space; wherein the first travel rail is arranged to extend adjacent a first space side transfer position for transferring articles between the first mobile body and the relay portion, and wherein the second travel rail is arranged to extend adjacent a second space side transfer position for transferring articles between the second mobile body and the relay portion through the opening.

With this configuration, when transporting an article from the first space to the second space, the first movable body holding the article to be transported travels to the first space side transfer position along the travel rail provided in the first space, and transfers the article to the relay portion located at a position adjacent the opening. And with the shutter being opened so that the opening is opened, the second movable body travels to the second space side transfer position along the second travel rail provided in the second space and receives the article to be transported supported by the relay portion provided in the first space through the opening. Thus, the article is relayed from the first movable body to the second movable body through the relay portion to transport the article to be transported from the first space to the second space.

Similarly, an article is relayed from the second movable body to the first movable body through the relay portion to transport the article to be transported from the second space to the first space.

And, since the first travel rail is provided in the first space such that it extends adjacent the first space side transfer position located in the first space, the first travel rail can be installed in the first space without a cut or a gap. Similarly, the second travel rail can be installed in the second space without a cut or a gap. Therefore, since each of the first movable body and the second movable body can travel on a continuous travel rail, generation of dust or vibration by the movable body traveling over a cut location of the travel rail can be prevented to the extent possible.

Further, the relay portion used to relay articles during transportation between the first movable body and the second movable body is located in the first space. And the relay portion is located adjacent the opening without interfering with the shutter which can open and close the opening by providing the shutter, for example, between the opening and the second space side transfer position. Therefore, the opening can be properly closed by the shutter despite the presence of the relay portion.

Thus, an article transport facility is provided in which the opening formed in the wall which divides the transporting space into the first space and the second space can be opened and closed by the shutter, and in which articles can be transported between the first space and the second space without generating dust and vibration by travel of the movable body to the extent possible.

An article transport facility in accordance with the present invention may also be embodied in an facility comprising: a wall that divides a space within the article transport facility into a first space and a second space, the wall defining an opening for communication between the first space and the second space; an opening-and-closing member configured to be moved between a closing position for closing the opening and an opening position for opening the opening; a first rail provided in the first space with no part of the first rail extending beyond the opening-and-closing member in the closing position and entering into the second space through the opening; a first movable body configured to travel along the first rail and to transport an article; a second rail provided in the second space with no part of the second rail extending beyond the opening-and-closing member in the closing position and entering into the first space through the opening; a second movable body configured to travel along the second rail and to transport an article; a relay portion located in the first space at a location adjacent the opening and configured to support an article, the relay portion being located at such a position that the relay portion can be accessed by the first movable body on the first rail and by the second movable body on the second rail.

BRIEF DESCRIPTION OF THE DRAWINGS

FIG. 6 is a perspective view of an important portion of the article transport facility in accordance with another embodiment.

DESCRIPTION OF THE PREFERRED EMBODIMENTS

A preferred embodiment of an article transport facility in accordance with the present invention is described next with reference to the drawings.

Figure 1:
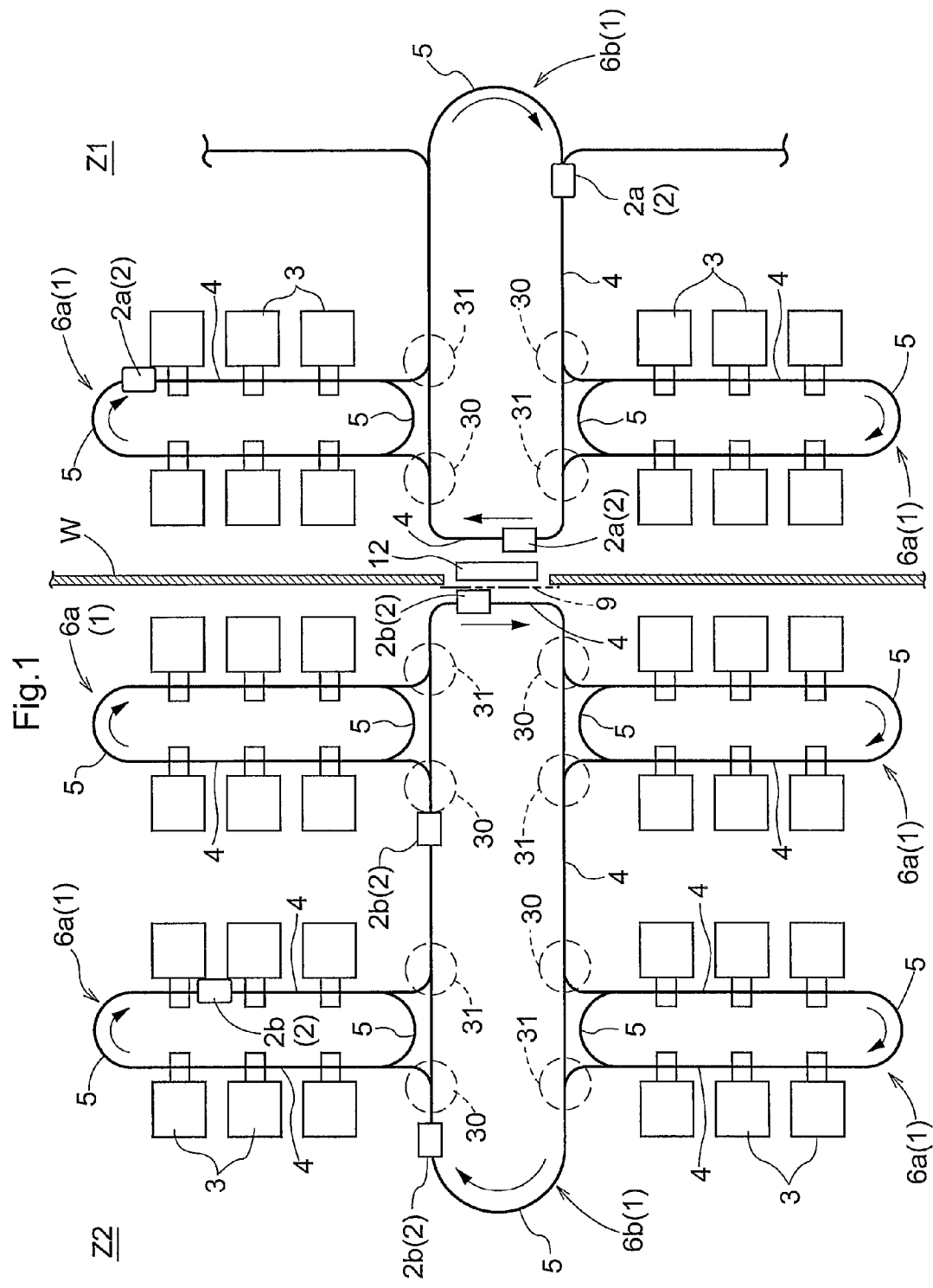
FIG. 1 is a plan view of the entire article transport facility.
Figure 2:
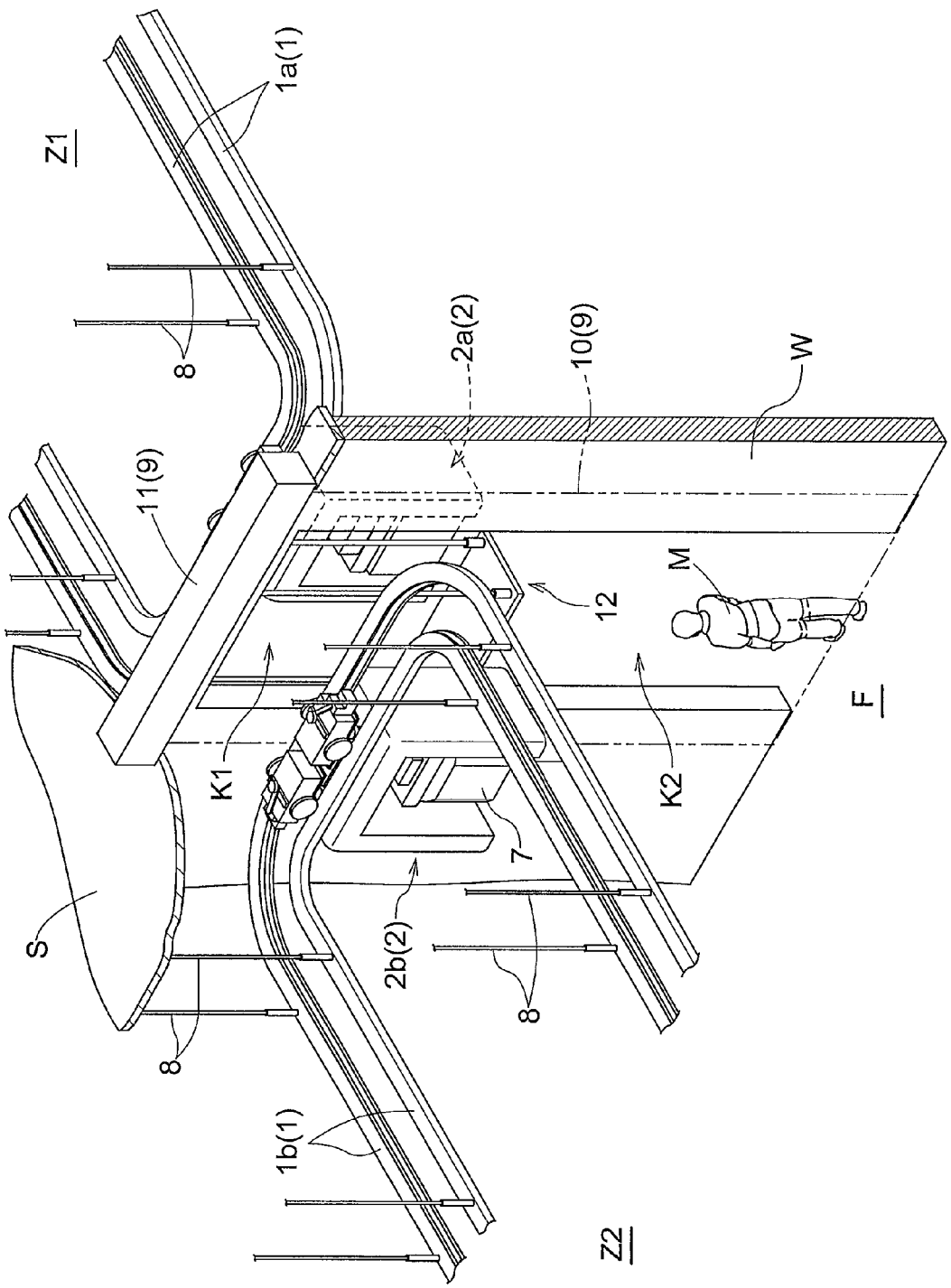
FIG. 2 is a perspective view of an important portion of the article transport facility.

As shown in FIGS. 1 and 2, a transporting space in the article transport facility is divided into a first space Z1 and a second space Z2 by a wall W. Provided in each of the first space Z1 and the second space Z2 is a plurality of article transport vehicles 2 which travel in a fixed direction (direction shown by the arrow in the drawing) along a travel rail 1 which forms a predetermined travel path which is formed by a combination of straight line portions 4 defining straight travel paths and curved portions 5 defining circular arc travel paths.

Each of a plurality of first article transport vehicles 2a provided in the first space Z1 corresponds to a first movable body which can travel along a first travel rail 1a provided in the first space Z1, and each of a plurality of second article transport vehicles 2b provided in the second space Z2 corresponds to a second movable body which can travel along a second travel rail 1b provided in the second space Z2.

And the predetermined travel path in the first space Z1 and the second space Z2 is arranged to extend by way of or adjacent a plurality of article processors 3 so that the article transport vehicles 2 can transport articles 7 among or between the plurality of article processors 3. In the present embodiment, each article 7 is a resin container for carrying two or more semiconductor substrates, but is not limited to this. The predetermined travel path shown in FIG. 1 include a plurality of auxiliary travel paths 6a each of which is loop-shaped and each of which extends by way of or adjacent a plurality of article processors 3, and a loop-shaped primary travel path 6b connected to each of the plurality of auxiliary travel paths 6a. The predetermined travel path is configured such that the article transport vehicles 2 can travel or branch at branch portions 30 from the primary travel path 6b to an auxiliary travel path 6a and can travel or merge at merging portion 31 from an auxiliary travel path 6a to the primary travel path 6a.

Figure 3:
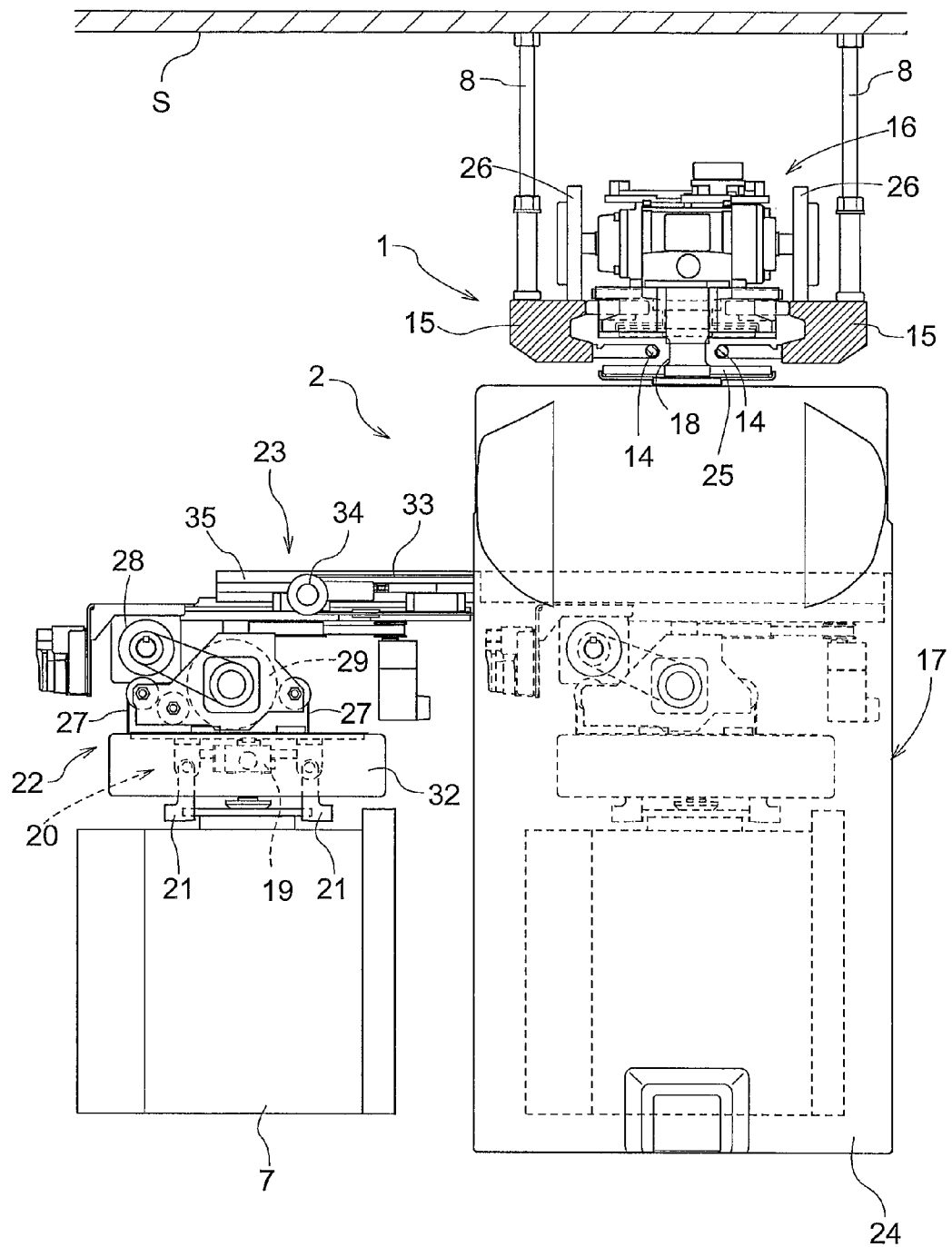
FIG. 3 is a front view of the ceiling transport vehicle.
Figure 4:
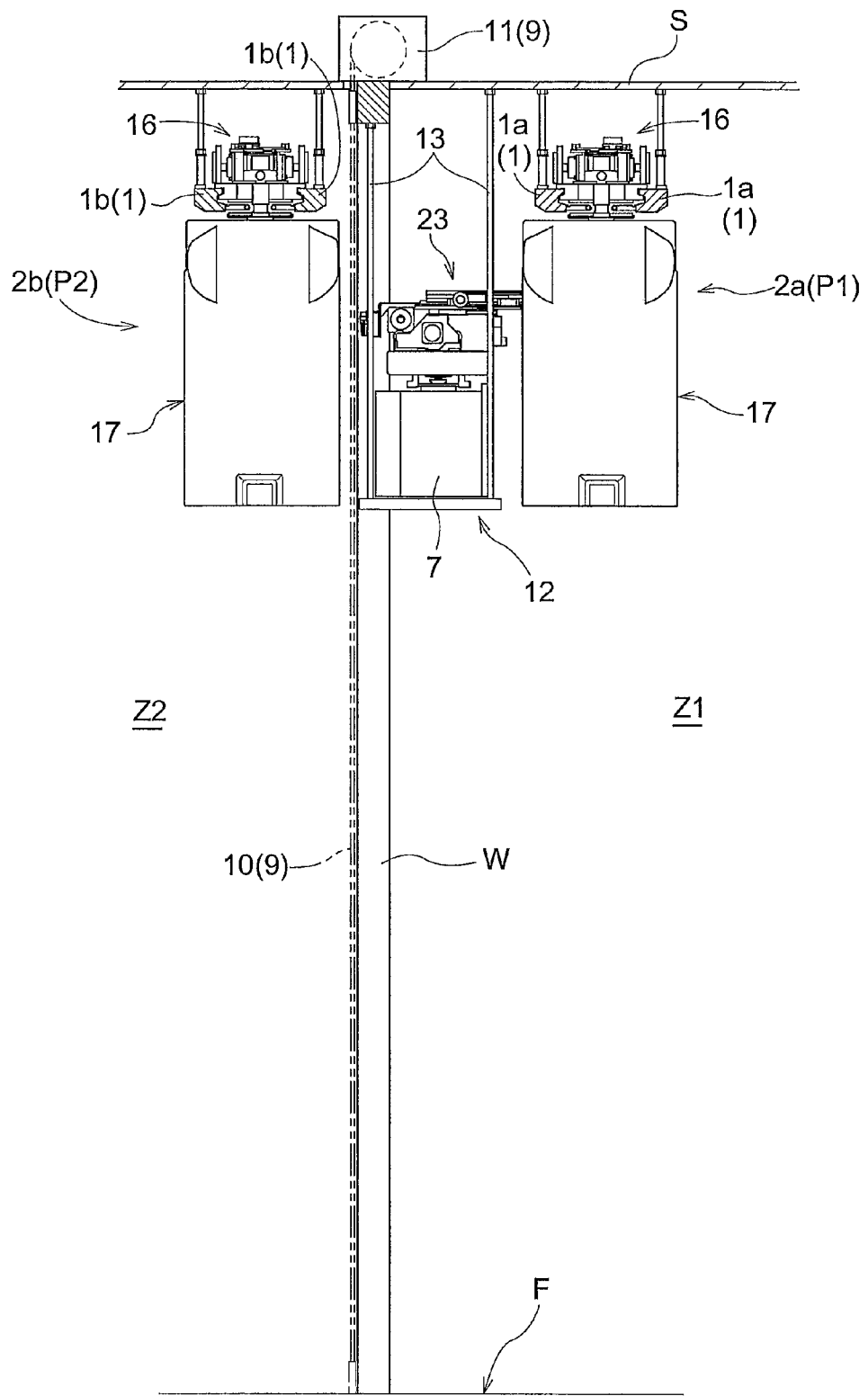
FIG. 4 is a side view of an important portion of the article transport facility.

As shown in FIGS. 2-4, each travel rail 1 is provided to the ceiling side or hang from the ceiling, and is arranged to extend along the predetermined travel path over the entire length of the primary travel path 6b and the plurality of auxiliary travel paths 6a. Each travel rail 1 is installed to the ceiling S by fixing it by means of travel rail brackets 8. FIG. 2 is a perspective view of the area where the wall W which divides the space into the first space Z1 and the second space Z2 is installed. FIG. 3 is a front view of the article transport vehicle 2 when viewed along the direction of its travel. FIG. 4 is a vertical sectional side view of an opening K1 formed in the wall W which divides the space into the first space Z1 and the second space Z2.

As shown in FIGS. 1, 2, and 4, the opening K1 which communicates the first space Z1 with the second space Z2 and vice versa is formed in the wall W. The opening K1 is located on the ceiling side, or closer to the ceiling. An operator passage opening K2 located on the floor F side or closer to the floor F and through which operators M can pass is formed in the wall W such that the operator passage opening K2 and the opening K1 are located vertically next to each other. In the present embodiment, the opening K1 for article transporting and the operator passage opening K2 are formed as one continuous opening that extends from the ceiling S to the floor surface F.

As shown in FIGS. 2 and 4, provided on the upper surface of the ceiling panel which defines a part of the ceiling S and above the opening K1 is a shutter of the type which raises and lowers a sheet-shaped member. The shutter 9 includes a single sheet-shaped opening-and-closing member 10, and a shutter case 11 which accommodates the opening-and-closing member 10 in its spooled state. When a fire breaks out in the first space Z1 or the second space Z2, the single opening-and-closing member 10 is fed out by activating the electric motor (not shown) provided within the shutter case 11 to cause it to provide a rotating force, closing both the opening K1 and the operator passage opening K2 and thus preventing spreading of the fire to the other space.

As shown in FIGS. 1, 2, and 4, located close to or adjacent the opening K1 in the first space Z1 is a relay portion 12 which can support articles 7 without interfering with the shutter 9 which opens and closes the opening K1. The relay portion 12 includes a plate-shaped quadrangle member which is fixedly supported to and suspended from the ceiling S by means of relay portion brackets 13 connected to the ceiling S and which is configured to be capable of supporting articles.

Figure 5:
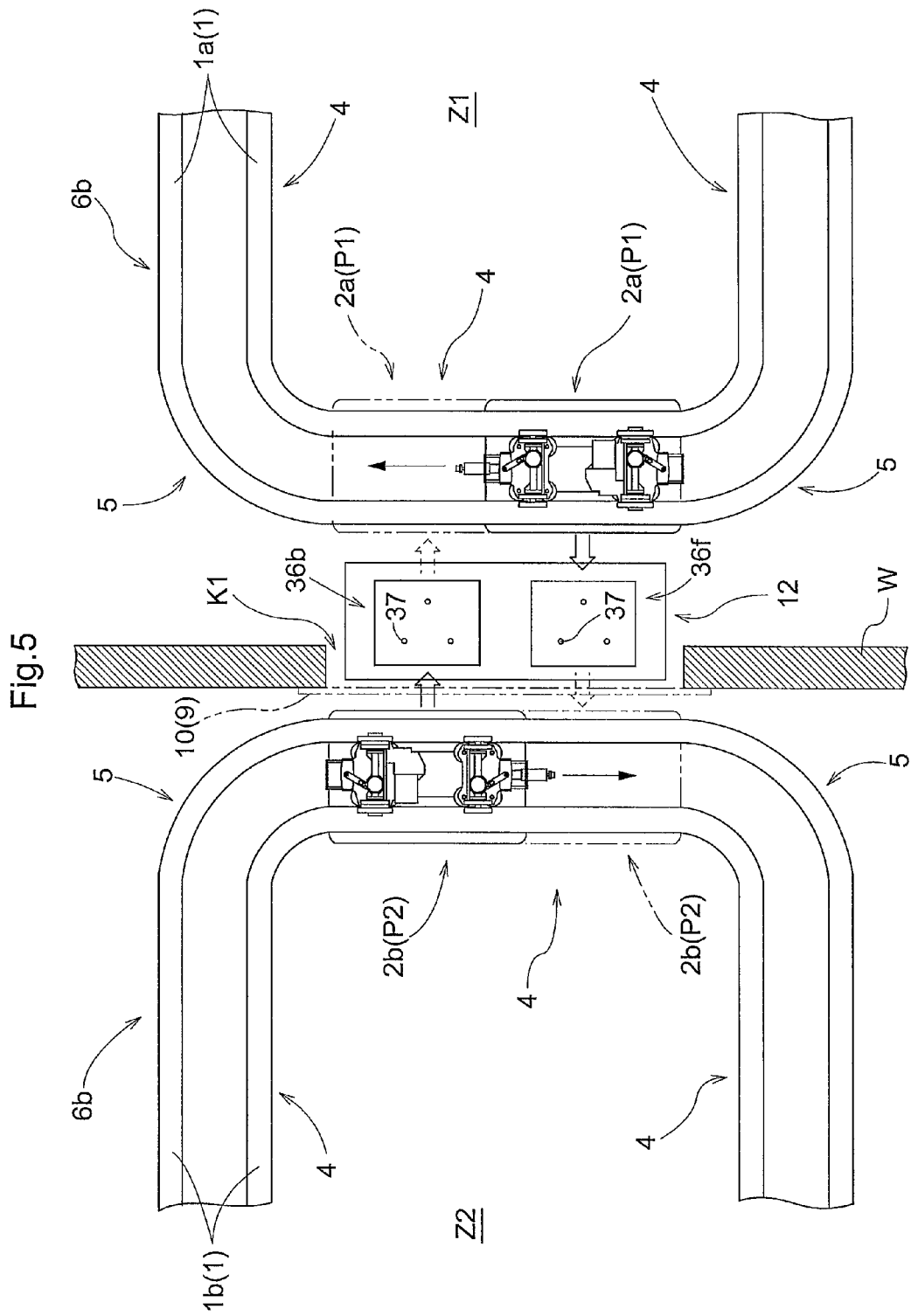
FIG. 5 is a plan view of an important portion of the article transport facility.

As shown in FIG. 5, the first travel rail 1a is configured to extend by way of or adjacent a first space side transfer position P1 at which articles 7 can be transferred between the first article transport vehicle 2a and the relay portion 12. And the second travel rail 1b is configured to extend by way of or adjacent a second space side transfer position P2 at which articles 7 can be transferred between the second article transport vehicle 2b and the relay portion 12 through the opening K1.

To describe the configuration of the travel rail in the area near the wall W, the first travel rail 1a in the first space includes curved portions 5 extending upstream and downstream of the straight line portion 4 which extends in the lateral width direction of the opening K1 (that is, the direction in which the side faces of Wall W extend in FIG. 5). And a straight line portion 4 extends from each curved portion to form a portion of the travel path which has a U-shape in plan view. The second travel rail 1b in the second space includes curved portions 5 extending upstream and downstream of the straight line portion 4 which extends in the lateral width direction of the opening K1. And a straight line portion 4 extends from each curved portion to form a portion of the travel path which has a U-shape in plan view.

And the U-shaped portion of the first travel rail 1a provided in the first space Z1 and the U-shaped portion of the second travel rail 1b provided in the second space Z2 are arranged to face each other at locations that are spaced apart by the same distance from the relay portion 12. That is, in the direction in which the first space Z1 and the second space Z2 are arranged (that is, the direction perpendicular to the direction in which the side faces of the wall W extend in FIG. 5), the relay portion 12 is located in the middle position between the straight line portion 4 of the first travel rail 1a and the straight line portion 4 of the second travel rail 1b, which are located on one and the other sides of the opening K1. Although it is preferable that the distance from the relay portion 12 to the first travel rail 1a is equal to the distance from the relay portion 12 to the second travel rail 1b as described above, it is desirable that the difference between the distance from the relay portion 12 to one of the first travel rail 1a and the second travel rail 1b and the distance from the relay portion 12 to the other of the first travel rail 1a and the second travel rail 1b does not exceed 20% (or more preferably 10%) of the distance from the relay portion 12 to the one of the first travel rail 1a and the second travel rail 1b. And, as shown in FIG. 5, the U-shaped portion of the second travel rail 1b is arranged or located to be closer to the wall W than the U-shaped portion of the first travel rail 1a. In other words, the wall W is located at a position which is offset toward the second travel rail 1b from the middle position of the relay portions 12 in the direction in which the first space Z1 and the 2nd space Z2 are arranged. In addition, as seen in plan view such as one shown in FIG. 5, one side edge of the relay portion 12 extends beyond the side wall of the wall W facing the first space Z1 to enter into the opening K1, but is located so as not to extend beyond the side face of the wall W that faces the second space Z2 and into the second space.

As shown in FIG. 3, the article transport vehicle 2 has a travel portion 16 including travel wheels 26 for traveling on the travel rail 1, and a main body portion 17 which is suspended and supported by the travel portion 16 and which supports an article 7 such that the article can be moved vertically. And a connecting member 18 which connects the travel portion 16 and the main body portion 17 is provided between a pair of rail portions 15.

Main body portion 17 includes a gripper 21 that functions as an article holding portion which can grip an article 7, vertical movement operating means 22 for vertically moving the gripper 21, slide operating means (laterally moving device) 23 for sliding and moving the vertical movement operating means 22 and the gripper 21 with respect to the travel portion 16 between a retracted position beneath the travel portion 16 and a projected position displaced in the lateral direction with respect to the travel portion 16, and a cover body 24 which covers an area above the article 7 supported by the gripper 21 as well as areas located forwardly and rearwardly, and an area located to one of the right and left of the article 7. And, a power receiving coil 25 is provided to the main body portion 17 such that it is located between the pair-of rail portions 15. A magnetic field is generated by applying alternating current to the electricity supply line 14 arranged along the travel rail 1 so that the magnetic field causes the power receiving coil 25 to generate electric power required by the article transport vehicle 2. Electric power is contactlessly supplied to the article transport vehicle 2 in this manner.

The vertical movement operating means 22 includes a rotation drum 29 rotated by an vertical movement motor 28 for spooling spooled belts 27, a switching mechanism 20 which is suspended and supported by the spooled belts 27 and which changes the attitude of the gripper 21 by an operation of a gripper motor 19 between a gripping attitude in which the gripper 21 grips the article 7 and a grip release attitude in which the gripper 21 releases the grip thus releasing the article, and a vertical movement support 32 which supports the rotation drum 29 and the switching mechanism 20. And the vertical movement operating means 22 can vertically move the gripper 21 and the article 7 supported by the gripper 21, through rotation of the rotation drum 29 actuated by the vertical movement motor 28, between a raised position in which the article 7 is located within the cover body 24 as seen in the traveling direction of the article transport vehicle 2 and a lowered position which is lower than the raised position. The switching mechanism 20 is actuated by the gripper motor 19 to change the attitude of the gripper 21 between the gripping attitude and the grip release attitude to grip and to release the grip on the article 7.

The slide operating means 23 includes a rotation pulley 34 which spools an endless belt 33 and which is rotated by a slide movement motor (not shown), a slide movement support 35 which supports the rotation pulley 34 such that the pulley 34 can rotate freely. And the slide movement support 35 is supported by the cover body 24 for movement in the lateral direction and an upper portion of the endless belt 33 is connected to the cover body 24 such that the slide movement support 35 is moved in the lateral direction with respect to the cover body 24 as the endless belt 33 is rotated. And the vertical movement support 32 is supported by the slide movement support 35 for movement in the lateral direction and is connected to a lower portion of the endless belt 33 such that the vertical movement support 32 is moved in the lateral direction with respect to the slide movement support 35 as the endless belt 33 is rotated.

With the slide operating means 23 thus configured, the rotation pulley 34 is rotated by the slide movement motor to rotate the endless belt 33 in a forward direction and the opposite direction to slide and move the slide movement support 35 with respect to the travel portion 16 in the lateral direction so that the slide movement support 35 and the vertical movement support 32 can slide and move to the same lateral side. And the slide operating means 23 is configured to be capable of sliding and moving the vertical movement operating means 22 and the gripper 21 between the retracted position in which the vertical movement operating means 22 and the gripper 21 are located directly below the travel portion 16 as shown by the phantom lines in FIG. 3 after the vertical movement operating means 22 and the gripper 21 are retracted toward the travel portion 16, and the projected position in which the vertical movement operating means 22 and the gripper 21 are located at a position displaced from directly below the travel portion 16 to one side in the lateral direction as shown by the solid lines in FIG. 3 after the vertical movement operating means 22 and the gripper 21 are slid and moved to project to one side in the lateral direction. As shown in FIG. 4, the projected position is set to be the location where the vertical movement operating means 22 and the gripper 21 are displaced to one side in the lateral direction with respect to the article transport vehicle 2 until the vertical movement operating means 22 and the gripper 21 overlap with the relay portion 12 in plan view when the article transport vehicle 2 transfers an article to or from the relay portion 12.

Thus, the first article transport vehicle 2a is configured to be able to horizontally move the gripper 21 of the first article transport vehicle 2a to the projected position at which the gripper 21 overlaps with the relay portion 12 in plan view with the first article transport vehicle 2a being stopped at the first space side transfer position P1, and is configured to be able to transfer the article to be transported 7 to and from the relay portions 12 with the article gripper 21 located in the projected position. And the second article transport vehicle 2b is configured to be able to horizontally move the gripper 21 of the second article transport vehicle 2b to the projected position with the second article transport vehicle 2b being stopped at the second space side transfer position P2, and is configured to be able to transfer the article to be transported 7 to and from the relay portions 12 with the article gripper 21 located in the projected position.

As shown in FIG. 5, the relay portion 12 includes two support portions 36 arranged in the lateral width direction of the opening K1 with each support portion 36 supporting one article 7. Each support portion 36 has three positioning pins 37 each of which engages each of the positioning engaging holes formed to have recessed portions at three locations on the bottom portion of the article 7 to properly position the article 7. And as travel stop positions for the article transport vehicles 2 for transferring articles 7 to or from these support portions 36, two locations for the first space side transfer position P1 are provided for the first article transport vehicle 2a and two locations for the second space side transfer position P2 are provided for the second article transport vehicle 2b for the two support portions 36. Incidentally, the opening-and-closing member 10 of the shutter 9 is shown by the phantom lines in FIG. 5. In present embodiment, the opening-and-closing member 10 is located on the side of the second space Z2 with respect to the side face of the wall W that faces the second space Z2, and is located such that a part of the side face of the opening-and-closing member 10 is in contact with the side face of the wall W that faces the second space Z2.

As described above, the article transport vehicles 2 can move in the directions shown by the arrows in FIG. 1 and along the travel rails 1. Therefore, on one or the other side of the relay portion 12, the first article transport vehicle 2a travels in a straight line from the first space side transfer position P1 (position shown by the solid lines in FIG. 5) located on the upstream side in the traveling direction toward the first space side transfer position P1 (the first space side transfer position P1 shown by the phantom lines in FIG. 5) located on the downstream side, and the second article transport vehicle 2b travels in a straight line from the second space side transfer position P2 (position shown by the solid lines in FIG. 5) located on the upstream side in the traveling direction toward the second space side transfer position P2 (the second space side transfer position P2 shown by the phantom lines in FIG. 5) located on the downstream side. Accordingly, the first travel rail 1a and the second travel rail 1b are configured such that the traveling direction in which the first article transport vehicle 2a travels through the first space side transfer positions P1 and the traveling direction in which the second article transport vehicle 2b travels through the second space side transfer positions P2 are opposite from each other.

And as shown in FIG. 5, the first article transport vehicle 2a transfers the article 7 to the forward direction relay support portion 36f with the first article transport vehicle 2a being stopped in the first space side transfer position P1 located on the upstream side in the traveling direction. That is, with the first article transport vehicle 2a being stopped in the first space side transfer position P1 located on the upstream side in the traveling direction, the slide operating means 23 is operated to project the vertical movement operating means 22 and the gripper 21 from the retracted position to the projected position. And the vertical movement operating means 22 then performs a lowering operation by a set amount to set or place the article 7 on the forward direction relay support portion 36f with the article 7 being properly positioned by the positioning pins 37. Thereafter, the switching mechanism 20 is operated to switch the attitude of the gripper 21 to the grip release attitude, and the vertical movement operating means 22 is operated to perform a rising operation by a set amount. Then, the slide operating means 23 is operated to retrieve the vertical movement operating means 22 and the gripper 21 from the projected position to the retracted position to complete the transfer of the article 7. In addition, the first article transport vehicle 2a receives an article 7 from the opposite direction relay support portion 36b with the first article transport vehicle 2a being stopped in the first space side transfer position P1 located on the downstream side in the traveling direction. That is, identically to when the article 7 is transferred to the relay portion 12, the slide operating means 23, the vertical movement operating means 22, and the switching mechanism 20 are operated in turn to receive the article 7.

On the other hand, the second article transport vehicle 2b transfers an article 7 to the opposite direction relay support portion 36b with the second article transport vehicle 2b being stopped in the second space side transfer position P2 located on the upstream side in the traveling direction. And the second article transport vehicle 2b receives an article 7 from the forward direction relay support portion 36f with the second article transport vehicle 2b being stopped in the second space side transfer position P2 located on the downstream side in the traveling direction.

That is, the one support portion 36 on the upstream side in the traveling direction of the first transporting vehicle 2a among the plurality of support portions 36 is designated as the forward direction relay support portion 36f to which an article 7 is transferred from the first transporting vehicle 2a and from which an article 7 is received by the second transporting vehicle 2b. And the one support portion 36 on the downstream side in the traveling direction of the first transporting vehicle 2a among the plurality of support portions 36 is designated as the opposite direction relay support portion 36f to which an article 7 is transferred from the second transporting vehicle 2b and from which an article 7 is received by the first transporting vehicle 2a.

In addition, when the first article transport vehicle 2a carrying no article 7 travels to receive an article 7 which had previously been transferred to the opposite direction relay support portion 36b of the relay portion 12 by the second article transport vehicle 2b, the first article transport vehicle 2a is stopped at the first space side transfer position P1 located on the downstream side in the traveling direction to receive the article 7 without being stopped at the first space side transfer position P1 located on the upstream side in the traveling direction. And when no article 7 is supported on the opposite direction relay support portion 36b, and when the first article transport vehicle 2 travels to deliver an article 7 it is carrying to the forward direction relay support portion 36f the relay portion 12, the first article transport vehicle 2a is stopped at the first space side transfer position P1 located on the upstream side in the traveling direction to transfer the article 7 to the relay support portion 36b, but continues on to travel afterward without being stopped at the first space side transfer position P1 located on the downstream side in the traveling direction. The same is true with the second article transport vehicle 2b.

With the article transport facility of the present embodiment described above, the second article transport vehicle 2b which travels in the second space Z2 can receive, through the opening K1, an article 7 which had been transferred to the relay portion 12 by the first article transport vehicle 2a which travels in the first space Z1. Or, conversely, the first article transport vehicle 2a which travels in the first space Z1 can receive an article 7 which had been transferred to the relay portion 12 through the opening K1 by the second article transport vehicle 2b which travels in the second space Z2. Therefore, articles to be transported 7 can be transported between the first space Z1 and the second space Z2 without the article transport vehicles 2 passing through the opening K1. Therefore, since the travel rail 1 does not have to have a cut or gap portion for allowing the shutter 9 to pass through the rail in the area of the opening K1, generation of dust when article transport vehicle 2 travel on the travel rail 1 can be prevented. And, since each article transport vehicle 2 transfers an article 7 to the relay portion 12 at a transfer position on the upstream side in the traveling direction and receives an article 7 from the relay portion 12 at a transfer position on the downstream side, the travel operation to transfer an article to be transported 7 to the relay portion 12 is used to receive another article 7 to be transported; thus, the article transport vehicles 2 are run in an efficient manner.

[Alternative Embodiments]

While the inventions made by the inventor(s) are described above based on embodiment(s) of inventions, the present inventions are not limited to the embodiment(s) described above, and various changes may be made without departing from the spirit of the inventions. Alternative embodiments of the present inventions are described next.

(1) In the embodiment described above, the movable body is described as an example to include an article holding portion which can be moved horizontally and vertically, the movable body may include an article holding portion which can not be moved horizontally instead. In this case, for example, a slide table may be provided in the relay portion, which can project and retract the support portion(s) in the direction in which the first space and the second space are arranged (that is, in the direction perpendicular to the direction in which the wall W extends).

(2) In the embodiment described above, a turntable may be provided to the support portion 36, that can rotate the three positioning pins 37 about a vertical axis. This would allow the orientation of the article 7 supported by the relay portion 12 to be changed.

(3) In the embodiment described above, the movable bodies are described to travel along the travel rail installed on the ceiling side, as an example. However, a movable body may be an article transport vehicle which can travel along a travel rail installed on the ground.

(4) In the embodiment described above, the movable bodies are described to be able to travel along the travel rail only in one direction. However, the movable bodies are not limited in this respect and may travel along the travel rail in both directions.

(5) In the embodiment described above, the travel rail portions on either lateral side of the relay portion are described to have a U-shape in plan view, as an example. However, the travel rail located on one side or both sides of the relay portion may be a single straight travel rail portion that guides the movable body in a direction toward and away from the relay portion. When the relay portion has a plurality of support portions, a single straight travel rail may be provided to each of such plurality of support portions with the straight travel rails arranged and spaced apart from each other in the lateral width direction of the opening.

(6) In the embodiment described above, the shutter is described to be a fire shutter whose opening is usually open and is closed only in case of a fire as an example. However, as described in JP Patent Application Publication No. H06-100163, the opening may usually be closed such as when the first and second spaces have a different atmospheric environment, and may be opened only when articles are transported through the opening. In addition, while the shutter is described to be a vertically movable type in which the opening-and-closing member is raised and lowered in the embodiment described above, the shutter may, for example, be of the type that opens to the right and left in which the opening-and-closing member is divided into two parts which can slide to the right and left: the specific configuration of the opening-and-closing member of the shutter may be changed.

(7) In the embodiment described above, one common opening is described to function both as the opening K1 for article passage and the operator passage opening K2 as an example. However, separate openings may be formed instead with one on the floor F side and the other on the ceiling S side separated or defined by a wall portion 38 provided between the opening K1 for article passage and the operator passage opening K2, as shown in FIG. 6.

What is claimed is:

1. An article transport facility having a movable body configured to travel along a travel rail provided in a transporting space and to transport an article, said article transport facility comprising:
    a wall that divides the transporting space into a first space and a second space, the wall defining an opening for communication between the first space and the second space;
    a shutter configured to open and close the opening;
    a relay portion located in the first space at a location adjacent the opening and configured to support an article without interfering with the shutter;
    a first movable body configured to travel along a first travel rail, which is a part of the travel rail that is provided in the first space;
    a second movable body configured to travel along a second travel rail, which is a part of the travel rail that is provided in the second space; wherein the first travel rail is arranged to extend adjacent a first space side transfer position for transferring articles between the first movable body and the relay portion, and wherein the second travel rail is arranged to extend adjacent a second space side transfer position for transferring articles between the second movable body and the relay portion through the opening,
    wherein the shutter is provided between the relay portion and the second travel rail,
    wherein the relay portion is provided with two or more support portions each of which supports an article with the support portions being arranged in a lateral width direction of the opening, and
    wherein the two or more support portions are located within a width in the lateral width direction of the opening.

2. An article transport facility as defined in claim 1, wherein each of the first and second movable bodies includes an article holding portion configured to hold an article, wherein the first movable body is configured to horizontally move the article holding portion of the first movable body to a projected position at which the article holding portion overlaps with the relay portion in plan view with the first movable body being stopped at the first space side transfer position, and is configured to transfer an article to be transported to and from the relay portion with the article holding portion located in the projected position, and wherein the second movable body is configured to horizontally move the article holding portion of the second movable body to a projected position at which the article holding portion overlaps with the relay portion in plan view with the second movable body being stopped at the second space side transfer position, and is configured to transfer an article to be transported to and from the relay portion with the article holding portion located in the projected position.

3. An article transport facility as defined in claim 1, wherein one of the first space side transfer positions is provided to each of the two or more support portions, and one of the second space side transfer positions is provided to each of the two or more support portions, wherein the first travel rail and the second travel rail are configured such that a traveling direction in which the first movable body travels through the first space side transfer positions and a traveling direction in which the second movable body travels through the second space side transfer positions are opposite from each other, wherein one of the two or more support portions that is located on an upstream side in the traveling direction of the first movable body is designated as a forward direction relay support portion to which an article is transferred from the first movable body and from which an article is received by the second movable body, and wherein one of the two or more support portions that is located on a downstream side in the traveling direction of the first movable body is designated as an opposite direction relay support portion to which an article is transferred from the second movable body and from which an article is received by the first movable body.

4. An article transport facility as defined in claim 1, wherein the first and second movable bodies are configured to travel along the travel rails installed on a ceiling side.

5. An article transport facility as defined in claim 1, wherein the first and second movable bodies are configured to travel along the travel rails installed on a ceiling side, wherein the opening is located on the ceiling side, wherein the relay portion is suspended from the ceiling and is configured to receive and support an article, wherein an operator passage opening located closer to a floor and through which operators can pass is formed in the wall such that the operator passage opening and the opening are located vertically next to each other, and wherein the shutter has a single opening-and-closing member that can open and close the opening and the operator passage opening.

6. An article transport facility comprising:
a wall that divides a space within the article transport facility into a first space and a second space, the wall defining an opening for communication between the first space and the second space;
an opening-and-closing member configured to be moved between a closing position for closing the opening and an opening position for opening the opening;
a first rail provided in the first space with no part of the first rail extending beyond the opening-and-closing member in the closing position and entering into the second space through the opening;
a first movable body configured to travel along the first rail and to transport an article; a second rail provided in the second space with no part of the second rail extending beyond the opening-and-closing member in the closing position and entering into the first space through the opening;
a second movable body configured to travel along the second rail and to transport an article;
a relay portion located in the first space at a location adjacent the opening and configured to support an article, the relay portion being located at such a position that the relay portion can be accessed by the first movable body on the first rail and by the second movable body on the second rail,
wherein the opening-and-closing member is provided between the relay portion and the second rail,
wherein the relay portion is provided with two or more support portions each of which supports an article with the support portions being arranged in a lateral width direction of the opening, and
wherein the two or more support portions are located within a width in the lateral width direction of the opening.

7. An article transport facility as defined in claim 6, wherein no part of the first rail overlaps with the relay portion in plan view, and no part of the second rail overlaps with the relay portion in plan view.

8. An article transport facility as defined in claim 6, wherein the movable body includes an article holding portion configured to hold an article, wherein the first movable body includes a first laterally moving device configured to move the article holding portion between a retracted position closer to the first movable body and a projected position displaced from the retracted position in a lateral direction perpendicular to a travel direction of the first movable body, wherein the second movable body includes a second laterally moving device configured to move the article holding portion between a retracted position closer to the second movable body and a projected position displaced from the retracted position in a lateral direction perpendicular to a travel direction of the second movable body, wherein the article holding portion of the first movable body is configured to transfer an article to or from the relay portion after being moved by the first laterally moving device to a position at which the article holding portion overlaps with the relay portion in plan view, and wherein the article holding portion of the second movable body is configured to transfer an article to or from the relay portion after being moved by the second laterally moving device to a position at which the article holding portion overlaps with the relay portion in plan view.

9. An article transport facility as defined in claim 6, wherein the first rail, the second rail, and the relay portion are suspended from a ceiling, wherein the opening extends from a position higher than the first rail and the second rail to a floor of the article transport facility, and wherein the opening-and-closing member is configured to cover an entire area of the opening.

10. An article transport facility as defined in claim 6, wherein the relay portion is positioned such that a part of the relay portion extends beyond a side face of the wall that faces the first space and into the opening in plan view.

11. An article transport facility as defined in claim 6, wherein the opening-and-closing member is positioned on a second space side with respect to a side face of the wall that faces the second space, wherein the relay portion is positioned such that one side edge of the relay portion is located close to the opening-and-closing member in plan view.

12. An article transport facility as defined in claim 6, wherein a difference between a distance from the relay portion to one of the first rail and the second rail and a distance from the relay portion to the other of the first rail and the second rail does not exceed 20% of the distance from the relay portion to the one of the first rail and the second rail.

* * * * *